{| style="border-collapse: collapse;"
|}

United States Patent
Marshall et al.

(10) Patent No.: US 7,570,076 B2
(45) Date of Patent: Aug. 4, 2009

(54) SEGMENTED PROGRAMMABLE CAPACITOR ARRAY FOR IMPROVED DENSITY AND REDUCED LEAKAGE

(75) Inventors: Andrew Marshall, Dallas, TX (US); Karan Singh Bhatia, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 417 days.

(21) Appl. No.: 10/964,802

(22) Filed: Oct. 13, 2004

(65) Prior Publication Data

US 2006/0082224 A1    Apr. 20, 2006

(51) Int. Cl.
 *H03K 19/00* (2006.01)
 *G06F 7/38* (2006.01)
 *H03K 19/177* (2006.01)
 *G06F 11/00* (2006.01)
 *G01R 31/28* (2006.01)
 *H04L 1/18* (2006.01)

(52) U.S. Cl. .............. 326/16; 326/37; 326/39; 326/40; 326/42; 326/44; 714/25; 714/36; 714/37; 714/733; 714/726; 714/750

(58) Field of Classification Search ........... 438/30; 326/16
 See application file for complete search history.

(56) References Cited

U.S. PATENT DOCUMENTS

| | | | | |
|---|---|---|---|---|
| 4,814,640 A | * | 3/1989 | Miyake | ............ 327/564 |
| 5,457,433 A | * | 10/1995 | Westwick | ............ 331/116 FE |
| 5,608,246 A | * | 3/1997 | Yeager et al. | ............ 257/295 |
| 6,285,620 B1 | * | 9/2001 | Ho et al. | ............ 365/225.7 |
| 6,415,181 B1 | * | 7/2002 | Schu et al. | ............ 607/16 |
| 6,721,910 B2 | * | 4/2004 | Ninomiya et al. | ............ 714/718 |
| 6,819,133 B1 | * | 11/2004 | Kliesner et al. | ............ 326/8 |
| 6,949,935 B1 | * | 9/2005 | Stenger et al. | ............ 324/548 |
| 2003/0058007 A1 | * | 3/2003 | Taguchi et al. | ............ 327/112 |
| 2003/0234637 A1 | * | 12/2003 | Stevenson et al. | ............ 323/282 |
| 2004/0104754 A1 | * | 6/2004 | Bruchhaus et al. | ............ 327/294 |

* cited by examiner

*Primary Examiner*—Vibol Tan
*Assistant Examiner*—Matthew C Tabler
(74) *Attorney, Agent, or Firm*—Warren L. Franz; Wade J. Brady, III; Frederick J. Telecky, Jr.

(57) ABSTRACT

A capacitor circuit and method to reduce layout area, leakage current, and to improve yield is disclosed. The circuit includes an output terminal (100), a plurality of circuit elements (322, 326, 330), and a plurality of transistors (320, 324, 328). Each transistor has a control terminal (314, 316, 318) and a current path coupled between the output terminal and a respective circuit element of the plurality of circuit elements. A control circuit (300) has a plurality of output terminals (314, 316, 318). Each output terminal is coupled to the control terminal of a respective transistor of the plurality of transistors. The control circuit produces control signals at respective output terminals to selectively turn off at least one transistor and turn on at least other transistors of the plurality of transistors at a first time.

29 Claims, 3 Drawing Sheets

SEGMENTED PROGRAMMABLE CAPACITOR ARRAY FOR IMPROVED DENSITY AND REDUCED LEAKAGE

FIELD OF THE INVENTION

This invention generally relates to electronic circuits, and more specifically to improved capacitor arrays in semiconductor integrated circuits.

BACKGROUND OF THE INVENTION

Semiconductor integrated circuits frequently require internal capacitors for various circuit applications. These circuit applications include linear capacitor arrays for analog circuits, resistor-capacitor delay stages, and decoupling capacitors for power supplies and other low frequency decoupling. These capacitors are frequently fabricated as parallel plate capacitors with a silicon dioxide dielectric. Referring to FIG. 1, the capacitance of such parallel plate capacitors is given by equation (1).

$$C = \frac{A\varepsilon_o \varepsilon_r}{d} \quad (1)$$

Here, A is the area of the capacitor and d is the dielectric thickness. The permittivity of free space $\varepsilon_o$ is 8.854e-14 farads/cm. The relative permittivity or dielectric constant $\varepsilon_r$ is a dimensionless property of the dielectric material. The relative permittivity for silicon dioxide is 3.9. Capacitance C for a parallel plate capacitor as in FIG. 1, therefore, is determined by geometrical parameters A and d, since $\varepsilon_o$ is fixed and $\varepsilon_r$ is determined by the silicon dioxide dielectric. Thus, capacitance C is proportional to area A and inversely proportional to dielectric thickness d.

For many applications, the parallel plate capacitor of FIG. 1 is formed with a thermally grown silicon dioxide dielectric 106. A lower plate 108 is formed by a crystalline silicon substrate and electrically connected to terminal C− 102. An upper plate 104 is formed by a polycrystalline silicon or metal electrode and electrically connected to terminal C+ 100. The crystalline silicon substrate is often highly doped with N-type or P-type impurities to reduce resistance. A good thermally grown silicon dioxide dielectric can typically withstand a maximum electric field of up to 10 MV/cm or 1 V/nm. Thus, thermally grown silicon dioxide dielectric is often preferred for high voltage applications. By way of comparison, a good deposited silicon dioxide dielectric may only tolerate a maximum electric field of up to 3 MV/cm or 0.3 V/nm. This deposited silicon dioxide dielectric, however, may be advantageously formed between metal or polycrystalline silicon plates. For either thermally grown or deposited silicon dioxide, however, operating voltages must be limited so that the maximum electric field remains well below the dielectric rupture threshold to avoid dielectric wear out over time. A minimum dielectric thickness d, therefore, is limited by circuit operating voltages. Any increase in capacitance C for a parallel plate capacitor having a silicon dioxide dielectric must be achieved by an increase in area A.

Alternative dielectrics are used to increase capacitance of parallel plate capacitors. Silicon nitride, having a dielectric constant of 9, is typically used as a composite dielectric with silicon dioxide to increase effective capacitance per unit area. For example, a composite dielectric stack comprising a silicon nitride layer formed between silicon dioxide layers is often used for dynamic random access memory cell storage capacitors. For the same dielectric thickness d, therefore, a memory cell storage capacitor with a silicon nitride dielectric will advantageously realize a capacitance equivalent to that of a silicon dioxide dielectric capacitor in 43% of the area.

Ferroelectric materials exhibit a substantially greater dielectric constant than either silicon nitride or silicon dioxide. The term ferroelectric is something of a misnomer, since present ferroelectric capacitors contain no ferrous material. Typical ferroelectric capacitors include a dielectric of ferroelectric material formed between two closely-spaced conducting plates. One well-established family of ferroelectric materials known as perovskites has a general formula $ABO_3$. This family includes Lead Zirconate Titanate (PZT) having a formula $Pb(Zr_xTi_{1-x})O_3$. This material is a dielectric with a desirable characteristic that a suitable electric field will displace a central atom of the lattice. This displaced central atom, either Titanium or Zirconium, remains displaced after the electric field is removed, thereby storing a net charge. A typical PZT dielectric constant is about 500. Another family of ferroelectric materials is Strontium Bismuth Titanate (SBT) having a formula $SbBi_2Ta_2O_9$. A typical SBT dielectric constant is about 200. However, state-of-the-art fabrication of both ferroelectric materials often results in a high defect density. The high defect density produces local areas of high leakage current proximate each defect. Thus, large area capacitors fabricated with these dielectrics may suffer from prohibitively high leakage.

Referring to FIG. 2, there is a hysteresis curve of a typical ferroelectric capacitor as in FIG. 1. The hysteresis curve includes net charge Q or polarization along the vertical axis and voltage V along the horizontal axis. By convention, the polarity of cell voltage is defined as shown in FIG. 1. A "0" state, therefore, is characterized by a positive voltage at terminal C− 102 with respect to terminal C+ 100. A "1" state is characterized by a negative voltage at terminal C− 102 with respect to terminal C+ 100. A "0" state is achieved by applying a voltage Vmax across the ferroelectric capacitor. This stores a saturation charge Qs in the ferroelectric capacitor. The ferroelectric capacitor, however, includes a linear component in parallel with a switching component. When the electric field is removed, therefore, the linear component discharges and only the residual charge Qr remains in the switching component. The "0" is transformed to a "1" state by applying −Vmax to the ferroelectric capacitor. This charges the linear and switching components of the ferroelectric capacitor to a saturation charge of −Qs. The stored charge reverts to −Qr when the electric field is removed. Finally, coercive points $V_C$ and $-V_C$ are minimum voltages on the hysteresis curve that will degrade a stored data state. For example, application of $V_C$ across a ferroelectric capacitor will degrade a "1" state even though it is not sufficient to produce a "0" state.

SUMMARY OF THE INVENTION

In accordance with a preferred embodiment of the invention, a capacitor circuit and method to improve reliability is disclosed. The circuit includes an output terminal, a plurality of capacitors, and a plurality of transistors. Each transistor has a control terminal and a current path coupled between the output terminal and a respective capacitor. A control circuit has a plurality of output terminals coupled to control terminals of respective transistors. The control circuit produces control signals at respective output terminals to selectively turn off at least one transistor and turn on at least other transistors of the plurality of transistors at a first time. Thus, capacitors may be selectively connected in parallel to the output terminal. Defective capacitors are excluded from connection to the output terminal.

BRIEF DESCRIPTION OF THE DRAWINGS

The foregoing features of the present invention may be more fully understood from the following detailed description, read in conjunction with the accompanying drawings, wherein.

DETAILED DESCRIPTION OF PREFERRED EMBODIMENTS

Figure 3:
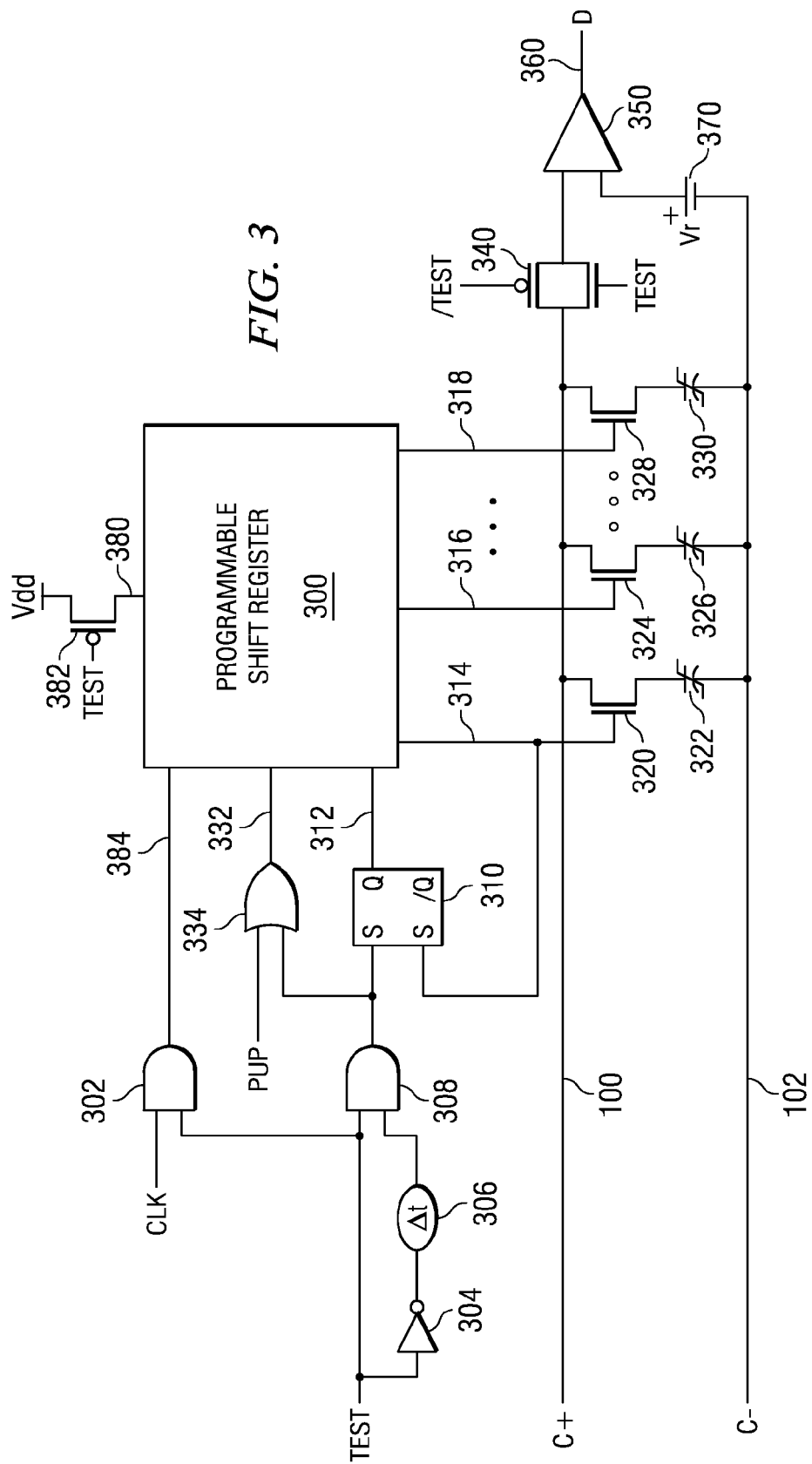
FIG. 3 is a capacitor circuit of the present invention.

Referring to FIG. 3, there is a capacitor circuit of the present invention. The capacitor circuit includes C+ output terminal 100 and C− output terminal 102. A plurality of capacitors 322, 326, and 330 are connected to output terminal C− 102. These capacitors preferably represent a large array of capacitors. Only three are shown, however, for clarification. Capacitors 322, 326, and 330 are preferably formed from a dielectric such as PZT or SBT. Such ferroelectric capacitors formed with a PZT dielectric advantageously exhibit a capacitance equivalent to that of a silicon dioxide dielectric in less than 1% of the area. Even if the thickness of the PZT dielectric is twice that of a silicon dioxide dielectric, the equivalent PZT capacitor area is only 1.5% of the silicon dioxide capacitor. The area of each capacitor is determined by anticipated defect density of the ferroelectric material. Each capacitor, therefore, has a maximum size that still provides a low probability of defects in each capacitor.

Plural transistors 320, 324, and 328 have respective current paths coupled between output terminal C+ 100 and respective capacitors of the plurality of capacitors. These transistors are preferably N-channel MOS transistors as are well known in the art. For alternative applications, however, the transistors may be P-channel MOS transistors, P-channel and N-channel MOS transistors, bipolar transistors, or other suitable switching devices. A control circuit, including programmable shift register 300, has a plurality of output terminals 314, 316, and 318 connected to control terminals of respective transistors 320, 324, and 328 of the plurality of transistors. The control circuit produces control signals at respective output terminals 314, 316, and 318 to selectively turn off at least one transistor and turn on other transistors of the plurality of transistors at a same time as will be explained in detail. The resulting total capacitance between output terminal C+ 100 and C− 102 is the sum of selected capacitors coupled to output terminal C+ 100 by respective transistors.

The capacitor circuit includes test circuitry to determine which of capacitors 322, 326, and 330 may be defective. The test circuitry includes a pulse generator formed by inverter 304, delay circuit 306, and AND gate 308. The test circuitry further includes AND gate 302, OR gate 334, P-channel transistor 382, CMOS pass gate 340, reference voltage Vr source 370, and comparator 350. Initial operation of the capacitor circuit begins when power up pulse PUP is applied to an input terminal of OR gate 334. A subsequent high level output pulse on lead 332 of programmable shift register 300 sets the state of control signals on leads 314, 316, and 318 in response to internal fuses. Initially, all fuses are intact and all control signals are high as will be explained in detail. The high level of these control signals turns on N-channel transistors 320, 324, and 328, thereby coupling capacitors 322, 326, and 330 to output terminal C+ 100. The capacitors are then charged by application of a voltage across terminals C+ 100 and C− 102.

The test circuitry is then activated by application of a high level test signal TEST and a low level of complementary test signal /TEST. The high level of signal TEST turns off P-channel transistor 382, thereby disconnecting fuses in the programmable shift register 300 from voltage supply Vdd. The rising edge of signal TEST generates a high level pulse signal at the output terminal of AND gate 308. This high level pulse resets the programmable shift register control signals 314, 316, and 318 to a low level in the absence of the Vdd voltage supply at the internal fuses. The low level control signals turn off N-channel transistors 320, 324, and 328, thereby disconnecting capacitors 322, 326, and 330 from output terminal C+ 100 and storing their respective charge. The high level pulse from AND gate 308 also sets the Q output of SR flip flop 310 at lead 312 to a high level.

Clock signal CLK is applied to one input of AND gate 302 at the end of a predetermined test time. Together with the high level of signal TEST, AND gate 302 produces a test clock signal TCLK on lead 384. The high level signal of the test clock signal at lead 384 loads the high level Q signal at lead 312 into a first stage of programmable shift register 300 to return the control signal at lead 314 to a high level. The high level at lead 314 turns on N-channel transistor 320. Other control signals at leads 316 and 318 remain low. Only the voltage on capacitor 322, therefore, appears across output terminals C+ 100 and C− 102. The high level at lead 314 also resets the Q signal of SR flip flop 310 to a low level.

The high level of signal TEST and low level of complementary signal /TEST turn on CMOS pass gate 340, thereby coupling the voltage at output terminal C+ 100 to one input terminal of comparator 350. A reference voltage Vr from source 370 is applied to the other input terminal of comparator 350. This reference voltage is preferably slightly less than the initial voltage across each of capacitors 322, 326, and 330. If capacitor 322 is not defective, the initial charge decays only slightly during the predetermined test time. At the end of the test time, therefore, the voltage across output terminals C+ 100 and C− 102 is greater than reference voltage Vr. Output signal D at lead 360 is then sampled and remains high. Alternatively, if capacitor 322 is defective, a substantial part of the initial charge has leaked away, and voltage across output terminals C+ 100 and C− 102 is less than reference voltage Vr when output signal D is sampled. Thus, a low level of output signal D at the end of the predetermined test time indicates that capacitor 322 is defective.

During the next cycle of clock signal CLK, the high level signal in the first stage of programmable shift register 300 is shifted into the second stage. The low level of output signal Q on lead 312 is loaded into the first stage of programmable shift register 300. Thus, N-channel transistors 320 and 328 are off, and capacitors 322 and 330 are disconnected from output terminal C+ 100. N-channel transistor 324 is turned on and couples capacitor 326 to output terminal C+ 100. The voltage across capacitor 326 is then compared to reference voltage Vr and produces a new output signal D on lead 360. A high level of output signal D indicates capacitor 326 is not defective. A low level of output signal D, however, indicates capacitor 326 is defective.

Subsequent cycles of clock signal CLK shift a high level control signal through each stage of programmable shift register 300. In this manner, the voltage level of each capacitor is compared to reference voltage Vr. The time to shift the high level control signal through each stage of programmable shift register 300 is preferably short compared to the predetermined test time for capacitor leakage. Thus, insubstantial capacitor leakage takes place between the sample time of the first stage capacitor 322 and the last stage capacitor 330. At the conclusion of testing, the fuses in the programmable shift register 300 corresponding to defective capacitors are blown by laser pulses as is well known in the art.

Subsequent application of power up pulse PUP in normal operation will set control signals on leads 314, 316, and 318 to a logic state corresponding to the state of the fuse. Thus, control signals corresponding to defective capacitors will remain low. Alternatively, control signals corresponding to non-defective capacitors will assume a high level, thereby coupling only good capacitors to output terminal C+ 100. The present invention, therefore, identifies defective capacitors and non-defective capacitors during a one-time test. The defective capacitors are then removed from the capacitor circuit by selectively blowing fuses. Remaining non-defective capacitors are connected in parallel across output terminals C+ 100 and C− 102 for use in normal circuit operation. The present invention provides a means of advantageously using high dielectric capacitors to conserve layout area. Defective capacitors are removed by conventional fuses such as polycrystalline silicon or metal fuses as is well known in the art. Thus, leakage current is minimized.

Figure 1:
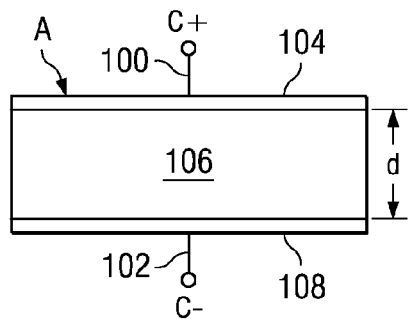
FIG. 1 is a circuit diagram of a ferroelectric capacitor.
Figure 2:
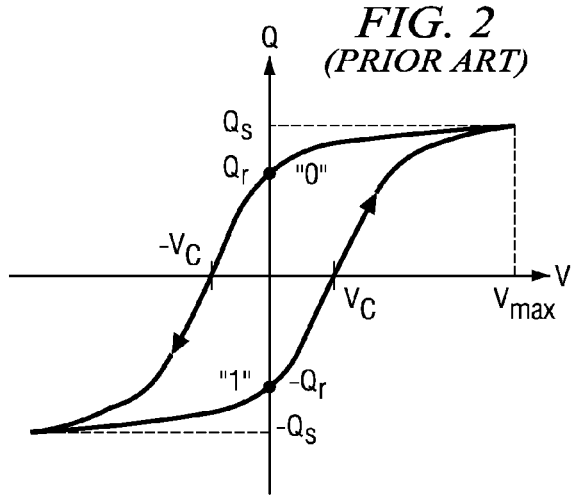
FIG. 2 is a hysteresis curve of the ferroelectric capacitor of FIG. 1.
Figure 4:
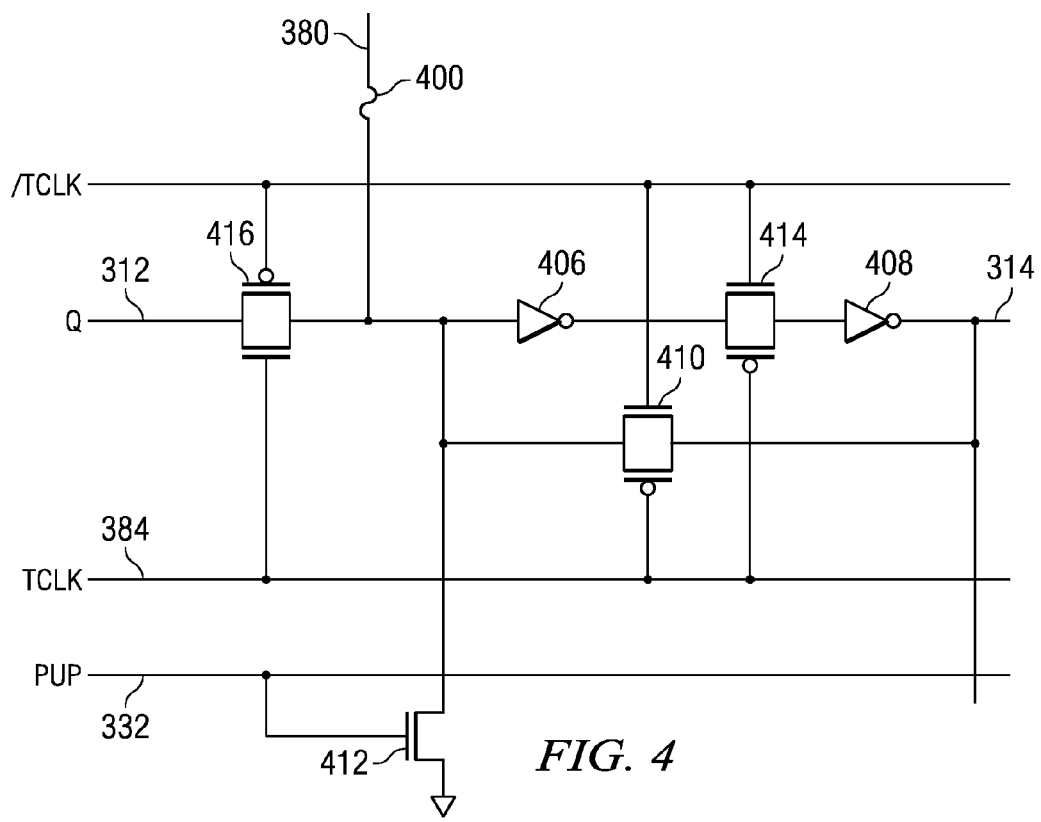
FIG. 4 is a first embodiment of a single stage of the programmable shift register 300 of FIG. 3.

Referring now to FIG. 4, there is an embodiment of a first stage of programmable shift register 300. Each stage of the programmable shift register is substantially identical. The shift register stage is coupled to receive test clock signal TCLK, complementary test clock signal /TCLK, the Q signal on lead 312 from SR flip flop 310, and power up signal PUP. Complementary test clock signal /TCLK is the inverse of test clock signal TCLK. Fuse 400 is coupled to receive supply voltage Vdd on lead 380 except during test mode operation. The first stage produces an output signal on lead 314 as an input to a second stage of the programmable shift register.

In test mode operation, test clock signal TCLK and complementary test clock signal /TCLK are initially low and high, respectively. Thus, CMOS pass gate 416 is off and CMOS pass gates 414 and 410 are on. CMOS pass gates 414 and 410 together with inverters 406 and 408 form a latch circuit having an input terminal connected to CMOS pass gate 416 and an output terminal connected to lead 314. Fuse 400 is disconnected from power supply Vdd by a high level of TEST signal TEST as previously explained. A high level pulse signal PUP turns on N-channel transistor 412, thereby pulling lead 314 to a low level. Thus, the latch circuit is initialized to store a low level at lead 314.

The first stage initially loads the high level Q signal on lead 312 from SR flip flop 310 at the rising edge of test clock signal TCLK and the falling edge of complementary test clock signal /TCLK. Respective high and low levels of signals TCLK and /TCLK simultaneously turn on CMOS pass gate 416 and turn off CMOS pass gates 414 and 410. The high level Q signal passes through CMOS pass gate 416 and is stored on the input gate capacitance of inverter 406. Inverter 406 responsively produces a low level output at the input terminal of CMOS pass gate 414. CMOS pass gate 414 remains off, however, and the previous high level is stored on the input gate capacitance of inverter 408. The corresponding low level output at lead 314 is, therefore, loaded into the second stage of programmable shift register 300 through a CMOS pass gate corresponding to first stage CMOS pass gate 416. Next, the falling edge of test clock signal TCLK and the rising edge of complementary test clock signal /TCLK turn off CMOS pass gate 416 and turn on CMOS pass gates 414 and 410. CMOS pass gate 410 is designed to be more resistive than CMOS pass gate 414, so a low level signal is driven onto the input terminal of inverter 408 and a corresponding high level signal is latched at output lead 314. Likewise, the previous low level signal from the first stage is simultaneously latched into the second stage. The high level signal at lead 314 turns on N-channel transistor 320, thereby connecting capacitor 322 to output terminal C+ 100 as previously explained (FIG. 3). The high level signal at lead 314 also resets the Q signal of SR flip flop 310 to a low level.

The next and subsequent cycles of test clock signal TCLK and complementary test clock signal /TCLK load the low level Q signal from SR flip flop 310 into the first stage of programmable shift register 300. Respective high and low levels of signals TCLK and /TCLK simultaneously turn on CMOS pass gate 416 and turn off CMOS pass gates 414 and 410. The low level Q signal passes through CMOS pass gate 416 and is stored on the input gate capacitance of inverter 406. Inverter 406 responsively produces a high level output at the input terminal of CMOS pass gate 414. CMOS pass gate 414 remains off, however, and the previous low level is stored on the input gate capacitance on inverter 408. The corresponding high level output at lead 314 is, therefore, loaded into the second stage of programmable shift register 300 through a CMOS pass gate corresponding to first stage CMOS pass gate 416. Next, the falling edge of test clock signal TCLK and the rising edge of complementary test clock signal /TCLK turn off CMOS pass gate 416 and turn on CMOS pass gates 414 and 410, so a high level signal is driven onto the input terminal of inverter 408 and a corresponding low level signal is latched at output lead 314. The previous high level signal from the first stage is simultaneously latched into the second stage. Subsequent cycles of test clock signal TCLK and complementary test clock signal /TCLK sequentially shift this high level signal through each stage of programmable shift register 300, thereby comparing the voltage stored on each capacitor of the capacitor array to reference voltage Vr. After all capacitors are tested, fuse 400 corresponding to each defective capacitor is preferably blown by laser pulse as is well known in the art.

Thereafter, in normal circuit operation test clock signal TCLK and complementary test clock signal /TCLK remain low and high, respectively. Thus, CMOS pass gate 416 remains off and CMOS pass gates 414 and 410 remain on. Test signal TEST also remains low, so P-channel transistor 382 remains on to provide Vdd supply voltage to fuse 400 via lead 380. A high level power up pulse signal PUP at lead 332 turns on N-channel transistor 412 in the first stage and corresponding N-channel transistors in other stages of the programmable shift register 300. If fuse 400 remains intact, the input terminal of inverter 406 and the output terminal at lead 314 are latched high after power up pulse signal PUP returns to a low level. Alternatively, if fuse 400 of any stage of the programmable shift register 300 is blown, the input terminal of inverter 406 and the output terminal at lead 314 are latched low after power up pulse signal PUP returns to a low level. In this manner, the control signal from each stage of programmable shift register 300 is latched at power up in a state to indicate the condition of the respective fuse 400. If the fuse is intact, the control signal from that stage is latched high, thereby connecting the respective capacitor to output terminal C+ 100. If the fuse is blown, however, the control signal from the corresponding stage is latched low, thereby disconnecting the defective capacitor from output terminal C+ 100.

Figure 5:
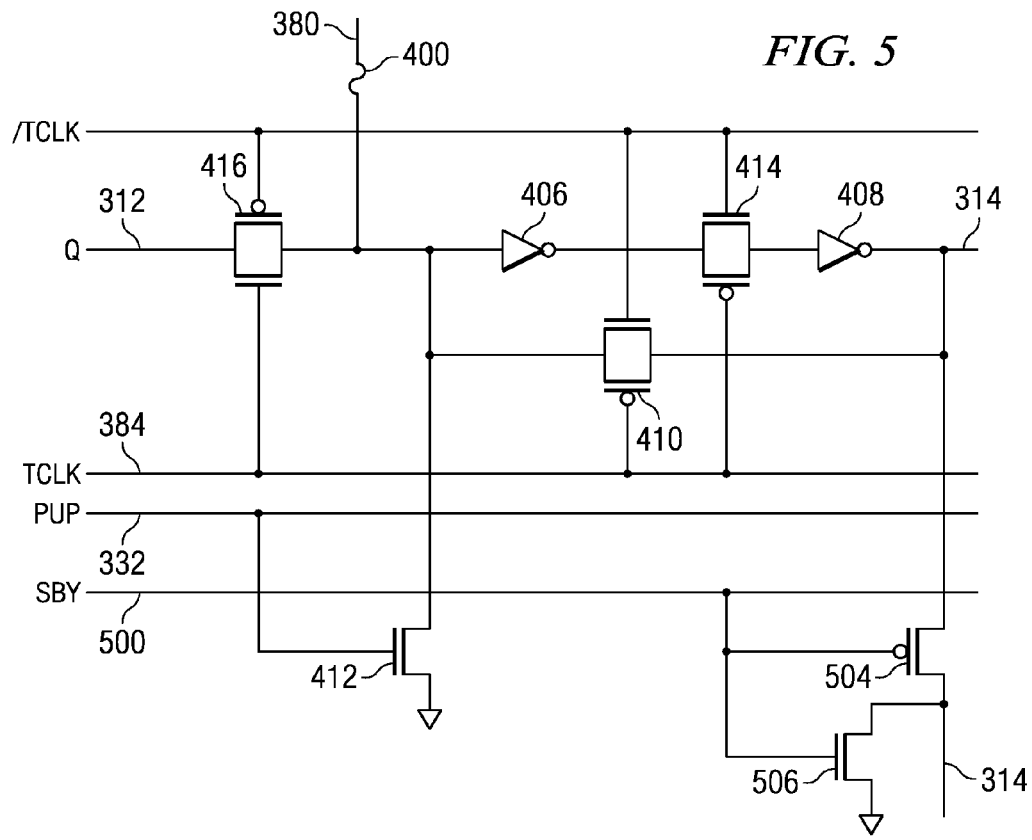
FIG. 5 is a second embodiment of a single stage of the programmable shift register 300 of FIG. 3.

Turning now to FIG. 5, there is another embodiment of a first stage of programmable shift register 300. Common circuit element identification numerals of FIG. 5 and FIG. 4 indicate the same function. Each stage of the programmable shift register 300 is substantially identical to the embodiment of FIG. 5. The shift register stage of FIG. 5 differs from the stage of FIG. 4 and includes standby signal SBY on lead 500, P-channel transistor 504, and N-channel transistor 506. Standby signal SBY is low in test mode operation and in normal operation. Thus P-channel transistor 504 is on and N-channel transistor 506 is off for both test mode operation and in normal operation. Otherwise, operation of each stage of programmable shift register 300 functions as previously described with respect to FIG. 4. The leakage of each capacitor corresponding to each stage of programmable shift register 300 is determined in test mode operation as previously described. Each fuse 400 is blown when the corresponding capacitor is defective. A control signal corresponding to the state of each fuse is then stored at output lead 314 in normal operation.

A standby mode is used in many semiconductor devices to conserve power when not in use. Many circuits may operate in standby mode at reduced voltage levels until required by system operation. In such a situation, standby signal SBY remains low during test mode and normal operation. Standby signal SBY goes high during standby mode to indicate the circuit is not in use. In the embodiment of FIG. 5, a high level of standby signal SBY turns off P-channel transistor 504, thereby disconnecting the latched signal at lead 313 from control signal lead 314. The high level of standby signal SBY turns on N-channel transistor 506 and drives control signal lead 314 low. The low level on lead 314 turns off N-channel transistors 320, 324, and 328 (FIG. 3) without regard to the state of fuse 400 of each respective shift register stage. The off state of the N-channel transistors advantageously disconnects all capacitors from output terminal C+ 100 during standby mode. Therefore, even slightly leaky capacitors that might have passed test mode evaluation are disconnected during standby mode. The embodiment of FIG. 5, therefore, advantageously eliminates any leaky capacitor contribution to standby current.

Figure 6:
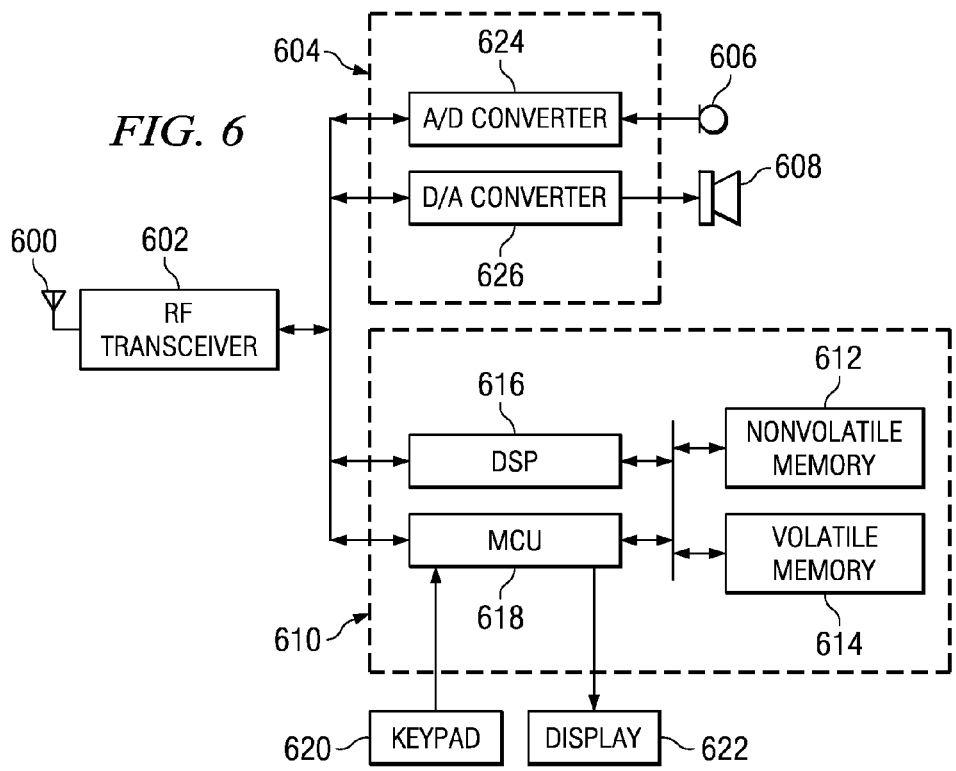
FIG. 6 is a schematic diagram of a portable electronic device that may advantageously use the capacitor circuit of the present invention.

Referring to FIG. 6, there is a block diagram of a wireless telephone as an example of a portable electronic device which could advantageously employ this invention in analog, memory, or processor devices as is known in the art. The wireless telephone includes antenna 600, radio frequency transceiver 602, baseband circuits 610, microphone 606, speaker 608, keypad 620, and display 622. The wireless telephone is preferably powered by a rechargeable battery (not shown) as is well known in the art. Antenna 600 permits the wireless telephone to interact with the radio frequency environment for wireless telephony in a manner known in the art. Radio frequency transceiver 602 both transmits and receives radio frequency signals via antenna 600. The transmitted signals are modulated by the voice/data output signals received from baseband circuits 610. The received signals are demodulated and supplied to baseband circuits 610 as voice/data input signals. An analog section 604 includes an analog to digital converter 624 connected to microphone 606 to receive analog voice signals. The analog to digital converter 624 converts these analog voice signals to digital data and applies them to digital signal processor 616. Analog section 604 also includes a digital to analog converter 626 connected to speaker 608. Speaker 608 provides the voice output to the user. Digital section 610 is embodied in one or more integrated circuits and includes a microcontroller unit 618, a digital signal processor 616, nonvolatile memory circuit 612, and volatile memory circuit 614. Nonvolatile memory circuit 612 may include read only memory (ROM), ferroelectric memory (FeRAM), FLASH memory, or other nonvolatile memory as known in the art. Volatile memory circuit 614 may include dynamic random access memory (DRAM), static random access memory (SRAM), or other volatile memory circuits as known in the art. Microcontroller unit 618 interacts with keypad 620 to receive telephone number inputs and control inputs from the user. Microcontroller unit 618 supplies the drive function to display 622 to display numbers dialed, the current state of the telephone such as battery life remaining, and received alphanumeric messages. Digital signal processor 616 provides real time signal processing for transmit encoding, receive decoding, error detection and correction, echo cancellation, voice band filtering, etc. Both microcontroller unit 618 and digital signal processor 616 interface with nonvolatile memory circuit 612 for program instructions and user profile data. Microcontroller unit 618 and digital signal processor 616 also interface with volatile memory circuit 614 for signal processing, voice recognition processing, and other applications.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, although embodiments of the present invention are directed to ferroelectric capacitors, the present invention is equally applicable to capacitors having other dielectric material. Furthermore, the present invention is equally applicable to other circuit elements that may be advantageously excluded from an array. It is therefore intended that the appended claims encompass any such modifications or embodiments.

What is claimed is:

1. An integrated circuit including a capacitor array, comprising:

a first output;

a second output;

a plurality of capacitors coupled in parallel current paths between the first and second outputs;

a plurality of transistors respectively coupled in series with the capacitors in the current paths, each transistor serving to connect or disconnect a respective capacitor into or out of its current path according to an on or off state of the transistor;

a control circuit including a programmable shift register with a plurality of stages; each stage comprising:

a stage output coupled to provide a control signal to a control terminal of a respective one of the transistors to control the on or off state of that transistor to connect or disconnect its corresponding capacitor responsive to a state of the control signal;

a programmable fuse element;

latching circuitry responsive to a setting of the fuse element for latching a normal state of the control signal to connect or disconnect the corresponding capacitor in a normal mode of operation; and shifting circuitry for shifting a test state of the control signal through the stage, with the shifting of the test state through the respective stages serving to sequentially connect individual ones of the capacitors in a test mode of operation;
wherein each capacitor has a capacitance, and a total capacitance across the first and second outputs is determined by a sum of the capacitances that are connected into their respective current paths.

2. The circuit of claim 1, wherein the integrated circuit further comprises circuitry for comparing a voltage stored on a connected individual one of the capacitors in the test mode with a reference voltage, to determine if that capacitor is defective.

3. The circuit of claim 2, wherein the fuse element is programmable to indicate whether the corresponding capacitor is defective; and wherein the latching circuitry latches a state of the control signal to disconnect the corresponding capacitor when the fuse element indicates that the corresponding capacitor is defective.

4. The circuit of claim 3, wherein the fuse element is a polycrystalline or metal fuse that can be blown to indicate that the corresponding capacitor is defective.

5. The circuit of claim 4, wherein the capacitors are ferroelectric capacitors formed with PZT or SBT dielectric elements.

6. The circuit of claim 1, wherein the latching circuitry includes first and second inverters connected in series, with an output of the second inverter coupled to an input of the first inverter; the output of the second inverter is also coupled to provide the control signal at the stage output; the fuse element is coupled between a first voltage source and the input of the first inverter; a second transistor is connected between the input of the first inverter and a second voltage source; and the second transistor has a control terminal connected to receive a power up signal; whereby, upon application of the power up signal, the control signal is set to an initial state determined by the second voltage source, and the control signal is thereafter latched to the normal state set by either the first voltage source or the initial state as determined by the setting of the fuse element.

7. The circuit of claim 6, wherein the shifting circuitry comprises a first pass gate, responsive to a test clock signal, for passing a test state from a test state input to the input of the first inverter; a second pass gate, responsive to the test clock signal, for decoupling an output of the first inverter from an input of the second inverter; and a third pass gate, responsive to the test clock signal, for decoupling the output of the second inverter from the input of the first inverter.

8. The circuit of claim 7, wherein the integrated circuit further comprises:
test circuitry, responsive to the test clock signal, for decoupling the first voltage source from the fuse element;
comparing circuitry for comparing a voltage stored on a connected individual one of the capacitors in the test mode with a reference voltage, to determine if that capacitor is defective; and
a fourth pass gate, responsive to the test clock signal, for coupling the comparing circuitry to the first and second outputs.

9. The circuit of claim 8, wherein the test circuitry further comprises a first AND gate having a first input for receiving a test signal and a second input; a pulse generator comprising an inverter and a delay circuit coupled between the first and second inputs of the first AND gate; a second AND gate having a first input for receiving a system clock signal, a second input for receiving the test signal, and an output for providing the test clock signal; an OR gate for providing a separate power up signal or a signal from the output of the first AND gate as a power up signal to the respective stages of the shift register; and a flip flop having inputs connected to the output of the first AND gate and to the stage output of a first stage of the shift register, and an output connected to provide the test state to the test state input of the first stage.

10. An integrated circuit including a capacitor array, comprising:
a first output;
a second output;
a plurality of capacitors coupled in parallel current paths between the first and second outputs;
a plurality of transistors respectively coupled in series with the capacitors in the current paths, each transistor serving to connect or disconnect a respective capacitor into or out of its current path according to an on or off state of the transistor;
a control circuit including a programmable shift register with a plurality of stages; each stage comprising:
a stage output coupled to provide a control signal to a control terminal of a respective one of the transistors to control the on or off state of that transistor to connect or disconnect its corresponding capacitor responsive to a state of the control signal;
a programmable fuse element;
latching circuitry responsive to a setting of the fuse element for latching a normal state of the control signal to connect or disconnect the corresponding capacitor in a normal mode of operation;
shifting circuitry for shifting a test state of the control signal through the stage, with the shifting of the test state through the respective stages serving to sequentially connect one of the capacitors and disconnect others of the capacitors in a test mode of operation; and
standby circuitry for setting a standby state of the control signal to disconnect the corresponding capacitor in a standby mode of operation;
wherein each capacitor has a capacitance, and a total capacitance across the first and second terminals is determined by a sum of the capacitances that are connected into their respective current paths.

11. The circuit of claim 10, wherein the integrated circuit further comprises circuitry for comparing a voltage stored on a connected individual one of the capacitors in the test mode with a reference voltage, to determine if that capacitor is defective.

12. The circuit of claim 11, wherein the fuse element is programmable to indicate whether the corresponding capacitor is defective; and wherein the latching circuitry latches a state of the control signal to disconnect the corresponding capacitor when the fuse element indicates that the corresponding capacitor is defective.

13. The circuit of claim 12, wherein the fuse element is a polycrystalline or metal fuse that can be blown to indicate that the corresponding capacitor is defective.

14. The circuit of claim 13, wherein the capacitors are ferroelectric capacitors formed with PZT or SBT dielectric elements.

15. The circuit of claim 14, wherein the transistors are N-channel MOS transistors with sources and drains connected in series with the capacitors, and gates connected to the stage outputs of respective shift register stages.

16. The circuit of claim 10, wherein the latching circuitry includes first and second inverters connected in series, with an output of the second inverter coupled to an input of the first inverter; the output of the second inverter is also coupled to provide the control signal at the stage output; the fuse element is coupled between a first voltage source and the input of the first inverter; a second transistor is connected between the input of the first inverter and a second voltage source; and the second transistor has a control terminal connected to receive a power up signal; whereby, upon application of the power up signal, the control signal is set to an initial state determined by the second voltage source, and the control signal is thereafter latched to the normal state set by either the first voltage source or the initial state as determined by the setting of the fuse element.

17. The circuit of claim 16, wherein the standby circuitry comprises circuitry, responsive to a standby signal, to decouple the output of the second inverter from the stage output and couple the second voltage source to the stage output.

18. The circuit of claim 17, wherein the standby circuitry further comprises a third transistor coupled between the output of the second inverter and the stage output, the third transistor having a control terminal coupled to turn the third transistor off in response to the standby signal; and a fourth transistor coupled between the second voltage source and the stage output, the fourth transistor having a control terminal coupled to turn the fourth transistor on in response to the standby signal.

19. The circuit of claim 18, wherein the shifting circuitry comprises a first pass gate, responsive to a test clock signal, for passing a test state from a test state input to the input of the first inverter; a second pass gate, responsive to the test clock signal, for decoupling an output of the first inverter from an input of the second inverter; and a third pass gate, responsive to the test clock signal, for decoupling the output of the second inverter from the input of the first inverter.

20. The circuit of claim 19, wherein the integrated circuit further comprises:
test circuitry, responsive to the test clock signal, for decoupling the first voltage source from the fuse element;
comparing circuitry for comparing a voltage stored on a connected individual one of the capacitors in the test mode with a reference voltage, to determine if that capacitor is defective; and
a fourth pass gate, responsive to the test clock signal, for coupling the comparing circuitry to the first and second outputs.

21. The circuit of claim 20, wherein said first, second, third and fourth pass gates are CMOS pass gates responsive to the test clock signal and to an inversion of the test clock signal.

22. The circuit of claim 20, wherein the test circuitry further comprises a first AND gate having a first input for receiving a test signal and a second input; a pulse generator comprising an inverter and a delay circuit coupled between the first and second inputs of the first AND gate; a second AND gate having a first input for receiving a system clock signal, a second input for receiving the test signal, and an output for providing the test clock signal; an OR gate for providing a separate power up signal or a signal from the output of the first AND gate as a power up signal to the respective stages of the shift register; and a flip flop having inputs connected to the output of the first AND gate and to the stage output of a first stage of the shift register, and an output connected to provide the test state to the test state input of the first stage.

23. The circuit of claim 22, wherein the flip flop is an SR flip flop; the flip flop inputs are S inputs; and the flip flop output is a Q output.

24. The circuit of claim 22, wherein the fuse element is a polycrystalline or metal fuse that can be blown to indicate that the corresponding capacitor is defective.

25. The circuit of claim 24, wherein the capacitors are ferroelectric capacitors formed with PZT or SBT dielectric elements.

26. The circuit of claim 24, wherein the transistors coupled in series with the capacitors are N-channel MOS transistors with sources and drains connected in series with the capacitors, and gates connected to the stage outputs of respective shift register stages.

27. An integrated circuit including a capacitor array, comprising:
a first output;
a second output;
a plurality of ferroelectric capacitors coupled in parallel current paths between the first and second outputs;
a plurality of MOS transistors with source/drain terminals respectively coupled in series with the capacitors in the current paths, each transistor serving to connect or disconnect a respective capacitor into or out of its current path according to an on or off state of the transistor;
a control circuit including a programmable shift register with a plurality of stages; each stage comprising:
a stage output terminal coupled to provide a control signal to a gate terminal of a respective one of the MOS transistors to control the on or off state of that transistor to connect or disconnect its corresponding capacitor responsive to a high or low state of the control signal;
a blowable fuse element;
latching circuitry responsive to a blown or unblown setting of the fuse element for latching a normal high or low state of the control signal to connect or disconnect the corresponding capacitor in a normal mode of operation; and
shifting circuitry for shifting a high or low test state of the control signal through the stage, with the shifting of the test state through the respective stages serving to sequentially connect individual ones of the capacitors and disconnect others of the capacitors in a test mode of operation;
wherein each capacitor has a capacitance, and a total capacitance across the first and second terminals is determined by a sum of the capacitances that are connected into their respective current paths.

28. The circuit of claim 27, wherein the integrated circuit further comprises circuitry for comparing a voltage stored on a connected individual one of the capacitors in the test mode with a reference voltage, to determine if that capacitor is defective.

29. The circuit of claim 28, wherein each stage further comprises standby circuitry for setting a high or low standby state of the control signal to disconnect the corresponding capacitor in a standby mode of operation.

* * * * *

UNITED STATES PATENT AND TRADEMARK OFFICE
CERTIFICATE OF CORRECTION

PATENT NO. : 7,570,076 B2 Page 1 of 1
APPLICATION NO. : 10/964802
DATED : August 4, 2009
INVENTOR(S) : Marshall et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 608 days.

Signed and Sealed this

Seventh Day of September, 2010

David J. Kappos
*Director of the United States Patent and Trademark Office*